US006406677B1

(12) United States Patent
Carter et al.

(10) Patent No.: US 6,406,677 B1
(45) Date of Patent: Jun. 18, 2002

(54) METHODS FOR LOW AND AMBIENT TEMPERATURE PREPARATION OF PRECURSORS OF COMPOUNDS OF GROUP III METALS AND GROUP V ELEMENTS

(75) Inventors: Michael T. Carter, Denver, CO (US); William J. Donahue, Westford, MA (US)

(73) Assignee: Eltron Research, Inc., Boulder, CO (US)

( * ) Notice: Subject to any disclaimer, the term of this patent is extended or adjusted under 35 U.S.C. 154(b) by 0 days.

(21) Appl. No.: 09/351,559

(22) Filed: Jul. 12, 1999

Related U.S. Application Data
(60) Provisional application No. 60/093,651, filed on Jul. 22, 1998.

(51) Int. Cl.$^7$ .................. C01B 35/00; C01B 21/064; C01B 25/00; C01B 9/00; C01F 7/00

(52) U.S. Cl. .................. 423/276; 423/290; 423/299; 423/300; 423/301; 423/351; 423/409; 423/412; 423/463; 423/464; 423/465

(58) Field of Search .................. 423/409, 412, 423/276, 290, 299, 300, 301, 351, 463, 464, 465

(56) References Cited

U.S. PATENT DOCUMENTS

| | | | |
|---|---|---|---|
| 4,029,740 A | | 6/1977 | Ervin, Jr. .................. 423/251 |
| 4,764,440 A | | 8/1988 | Jones et al. .................. 429/198 |
| 4,764,489 A | * | 8/1988 | Bolt .................. 423/412 |
| 4,883,567 A | | 11/1989 | Verbrugge et al. .................. 204/39 |
| 4,904,355 A | | 2/1990 | Takahashi .................. 204/58.5 |
| 5,041,512 A | * | 8/1991 | Tebbe .................. 423/409 |
| 5,096,789 A | | 3/1992 | Melton et al. .................. 429/112 |
| 5,135,825 A | | 8/1992 | Mori et al. .................. 429/194 |
| 5,260,397 A | * | 11/1993 | Jensen .................. 423/412 |
| 5,264,111 A | | 11/1993 | Carpenter et al. .................. 205/232 |
| 5,463,158 A | | 10/1995 | Goldezinowski et al. .................. 585/520 |
| 5,543,522 A | | 8/1996 | Kawahara et al. .................. 546/2 |
| 5,552,241 A | | 9/1996 | Mamantov et al. .................. 429/103 |

OTHER PUBLICATIONS

Adjaottor, A.A. and Griffin, G.L., "Aerosol Synthesis of Aluminum Nitride Powder Using Metalorganic Reactants"(1992) *J. Am. Ceram. Soc.*, 75:3209–3214, No Month.
Akiyama, M. et al., "Influence of substrate temperature on physical structure of AlN thin films prepared on polycrystalline MoS$_2$ by rf magnetron sputtering," (1995) *J. Am. Ceram. Soc.*, 78:3304–3308, No Month.
Cheek, G. and Osteryoung, R.A., "An Electrochemical and Infrared Study of Chloranil in n-Butylpyridinium Chloride: Aluminum Chloride Ionic Liquid" (1982) *J. Electrochem. Soc.*, 129:2739–2745, No Month.

Fannin, A.A. et al., "Properties of 1,3–Dialkylimidazolium Chloride—Aluminum Chloride Ionic Liquids. 2. Phase Transitions, Densities, Electrical Conductivities, and Viscosities" (1984) *J. Phys. Chem.*, 88:2614–2621, No Month.
Hashimoto, N. and Yoden, H., "Sintering Behavior of Fine Aluminum Nitride Powder Synthesized from Aluminum Polynuclear Complexes" (1992), *J. Am. Ceram. Soc.*, 75:2098–2106, No Month.
Interrante, L.V. and Lee, W., "Preparation and Properties of Aluminum Nitride Films Using an Organometallic Precursor" (1989), *J. Electrochem. Soc.*, 136:472–478, No Month.
Jacobs, H. and Nöcker, B., "$AlCl_3 \cdot 2NH_3$—a Compound with the Crystal Structure of a Tetraamine Dichloroaluminiumtetrachloroaluminate—$[AlCl_2(NH_3)_4]+[AlCl_4]$ ."(1992), *Z. Anorg. Allg. Chem.*, 614:25–29, No Month.
Jacobs, H. and Nöcker, B., "$AlCl_3 \cdot 3NH_2$—a Compound with the Crystal Structure of a Tetraammine Dichloro Aluminium–Diammine Tetrachloro Aluminate: $[AlCl_2(NH_3)_4]+ [AlCl_4(NH_3)_2]$ . ", *Z. Anorg. Allg. Chem.*, 619:73–76, No Month.
Jones, S.D. and Blomgren, G.E., "Low–Temperature Molten Salt Electrolytes Based on Aralkyl Quaternary or Ternary Onium Salts" (1989), *J. Electrochem. Soc.*, 136:424–427, Feb.
D.W. Lewis, "Properties of Aluminum Nitride Derived from $AlCl_3 \cdot NH_3$" (1970), *J. Electro. Soc.*, 117:978–982, Jul.
K.G. Nickel et al., *J. Am. Ceram. Soc.*, 72:1804 (1989), No Month.
Osteryoung, R.A., "Organic Chloraluminate Ambient Temperature Molten Salts" in *Molten Salt Chemistry*, G. Mamantov and R. Marassi (Eds), NATO ASI Series C, vol. 202, D. Reidel Publishing Co., Dordrecht, Netherlands (1987) 329–364, No Month.
Park, S–G. et al., "A Mixed Lewis Acid–Brønsted Acid Ambient Temperature Ionic Liquid: An Electrochemical and NMR Study of Dimehtylaniline" (1991), *J. Am. Chem. Soc.*, 113:3334–3340, No Month.
Paterson, W.G. and Onyszchuk, M. "The Interatction of Hydrazine with Boron and Aluminium Halides" (1963), *Can. J. Chem.*, 41:1872–1876, No Month.
Robinson, J. and Osteryoung, R.A., "An Electrochemical and Spectroscopic Study of Some Aromatic Hydrocarbons in the Room Temperature Molten Salt System Aluminium Chloride–n–Butylpyridinium Chloride," (1979), *J. Amer. Chem. Soc.* 101(2):323–327, No Month.

(List continued on next page.)

*Primary Examiner*—Steven Bos
(74) *Attorney, Agent, or Firm*—Greenlee, Winner and Sullivan, P.C.

(57) ABSTRACT

Processes are provided for preparation of precursors of Group III-V compounds, i.e., nitrides, phosphides, arsenides, antimonides and bismuthides of boron, aluminum, gallium and indium. The precursors are easily converted, e.g., by thermal decomposition, to the Group III-V compounds which are useful as thin-film coatings for aerospace components or as powders which may be shaped as desired.

22 Claims, 9 Drawing Sheets

OTHER PUBLICATIONS

Ross, C.B. et al., "Electrochemical Synthesis of Metal Nitride Ceramic Precursors in Liquid Ammonia Electrolyte Solutions" (1991), *Chem. Mater.*, 3:768–771, No Month.

Sheppard, L.M. "Aluminium Nitride: A Versatile but Challenging Material" (1990), *Ceramic Bull.*, 69:1801–1812, No Month.

Uribe, F.A. and Osteryoung, R.A. "Electrochemical and Spectroscopic Studies of 1,4–Benzoquinone in Ambient Temperature Chloroaluminate Ionic Liquids," (1988), *J. Electrochem. Soc.* 135(2):378–381, No Month.

S.P. Wicelinski et al., "Low Temperature Chlorogallate Molten Salt Systems." (1987), *J. Electrochem. Soc.*, 134:262–263, No Month.

Wilkes, J.S. et al., "Dialkylimidazolium Chloroaluminate Melts: A New Class of Room–Temperature Ionic Liquids for Electrochemistry, Spectroscopy and Synthesis" (1982), *Inorg. Chem.*, 21:1263–1264, No Month.

* cited by examiner

METHODS FOR LOW AND AMBIENT TEMPERATURE PREPARATION OF PRECURSORS OF COMPOUNDS OF GROUP III METALS AND GROUP V ELEMENTS

CROSS-REFERENCE TO RELATED APPLICATIONS

This application claims priority to provisional application No. 60/093,651 filed Jul. 22, 1998.

STATEMENT REGARDING FEDERALLY SPONSORED RESEARCH

This invention was made with Government support under Contract No. DMI-9660631 awarded by the National Science Foundation. The Government has certain rights in the invention.

BACKGROUND OF THE INVENTION

Aluminum nitride (AlN), gallium nitride (GaN) and indium nitride (InN) are advanced materials of emerging importance for a number of applications in the microelectronics, optoelectronics, aerospace and other industries (L. M. Sheppard, Ceramic Bull., 69:1801–1812 (1990), "Aluminum Nitride: A Versatile but Challenging Material"). AlN is an ideal heat transfer medium for high power electronic devices and multichip modules because of its favorable thermal and electronic conductivity. It is also highly refractory and mechanically strong, making it useful for high temperature processes and abrasion and corrosion protection of surfaces. Depending on the specific application, bulk powder or a thin film may be required.

Bulk powders are used to press shapes, such as crucibles or rods and other structures. Popular methods of preparing bulk powder AlN comprise carbothermal reduction of $Al_2O_3$ in the presence of nitrogen and direct nitridation of metallic aluminum and reaction of $AlCl_3$ with $NH_3$. (L. M. Sheppard, 1990, supra). Each method has certain advantages and drawbacks. Carbothermal reduction proceeds at 1100° C., with removal of unreacted carbon at 600–700° C. in dry air and further heating at 1400° C. in vacuum. Residual carbon and oxide impurity in the final material can be a problem for batch quality.

Direct nitridation (1200° C.) suffers from incomplete conversion of starting materials and coalescence of metallic aluminum. Gas phase approaches, such as reaction of $AlCl_3$ with $NH_3$, are inherently low yield. Bulk polymeric aminoalane $AlCl_3$ precursors have been prepared electrochemically by anodization of an Al electrode in liquid $NH_3$ at −70° C. (C. B. Ross et al., Chem. Mater., 3:768–771 (1991), "Electrochemical Synthesis of Metal Nitride Ceramic Precursors in Liquid Ammonia Electrolyte Solutions"). Thermal decomposition of polyaminoalanes prepared by direct reaction of neat $N_2H_4$ with $AlCl_3$ has been reported (W. G. Paterson and M. Onyszchuk, Can. J Chem., 41:1872–1876 (1963), "The Interaction of Hydrazine with Boron and Aluminum Halides").

Thin films commonly needed in microelectronic or surface protection applications are usually prepared by thermal decomposition of a gas phase precursor at high temperature by chemical vapor deposition (CVD). A number of these precursors have been reported including $[(CH_3)_2AlNH_2]_3$(L. V. Interrante et al., J Electrochem. Soc., 136:472–478 (1989), "Preparation and Properties of Aluminum Nitride Films Using an Organometallic Precursor"), $Al(C_2H_5)_3$+$NH_3$ (A. A. Adjaottor and G. L. Griffin, J. Am. Ceram. Soc., 75:3209–3214 (1992), "Aerosol Synthesis of Aluminum Nitride Powder Using Metalorganic Reactants") and basic aluminum chloride/glucose (N. Hashiomoto et al., J Am. Ceram. Soc., 75:2098–2106 (1992), "Sintering Behavior of Fine Aluminum Nitride Powder Synthesized from Aluminum Polynuclear Complexes"). The common problem of CVD with these materials is that they contain carbon and/or oxygen in their structures, which then contaminates the final product as oxide or carbide. This has implications for thermal conductivity of the material, which depends on impurity levels. CVD methods can be quite complex as well, requiring optimization of formation of the precursor in the gas phase in addition to optimization of the CVD reaction itself.

Processes using molten salts to produce metal nitrides have been reported; however, these reactions are run at temperatures higher than 200° C. See, e.g., U.S. Pat. No. 4,029,740 to Ervin, Jr. for "Method of Producing Metal Nitrides."

Chloroaluminate molten salts combined with alkali metal chlorides to provide Lewis acid-base neutrality are described in U.S. Pat. No. 5,096,789. This patent does not teach the desirability of acidic melts nor the preparation of nitrides.

Ambient temperature molten salts of chloroaluminates and 1-butylpyridinium chloride and 1-ethyl-3-methylimidazolium chloride are described in Osteryoung, R. A., (1987) "Organic Chloroaluminate Ambient Temperature Molten Salts," in Molten Salt Chemistry, G. Mamantov and R. Marassi (eds): 329–364. Electrochemical and spectroscopic behavior of certain hydrocarbons in $AlCl_3$-1-butylpyridinium chloride or 1-ethyl-3-methylimidazolium chloride molten salt systems have been studied as reported in Robinson, J. and Osteryoung, R. A. (1979), "An Electrochemical and Spectroscopic Study of Some Aromatic Hydrocarbons in the Room Temperature Molten Salt System Aluminum Chloride-n-Butylpyridinium Chloride," J. Amer. Chem. Soc. 101(2):323–327; and Uribe, F. and Osteryoung, R. A. (1988), "Electrochemical and Spectroscopic Studies of 1,4-Benzoquinone in Ambient Temperature Chloroaluminate Ionic Liquids," J. Electrochem. Soc. 135(2):378–381.

Plating baths for electrodeposition of aluminum using molten salt baths comprising aluminum halide and a quaternary ammonium salt comprising an alkylimidazolium halide are disclosed in U.S. Pat. No. 4,904,355 to Takahashi for "Plating Bath for Electrodeposition of Aluminum and Plating Process of Making Use of the Bath." U.S. Pat. No. 5,135,825 to Mori et al. for "Method for Producing Ambient Temperature Molten Salt Consisting of Certain Pyridinium and Imidazolium Halides and an Aluminum Trihalide" discloses the use of an inert solvent having a low boiling point for making a molten salt. U.S. Pat. 5,543,522 to Kawahara et al. for "Process for Preparing an Ambient Temperature Molten Salt Using Thionyl Chloride" discloses ambient temperature molten salts for electroplating comprising aluminum halide and onium halide together with thionyl chloride. U.S. Pat. No. 5,552,241 to Mamantov et al. for "Low Temperature Molten Salt Compositions Containing Fluoropyrazolium Salts" discloses mixtures of metal halides and fluoropyrazolium salts for use in electrochemical cells. The use of such salts in processes for forming metal nitrides, however, is not suggested in these patents.

Molten salts of aluminum, gallium or indium with hydrocarbyl-saturated onium ions are disclosed in U.S. Pat. No. 4,764,440 to Jones and Blomgren for "Low Temperature Molten Compositions." These salts are molten below about 100° C. U.S. Pat. No. 4,883,567 to Verbrugge et al. for "Method of Plating Metallo-gallium Films" discloses the use of a room-temperature melt consisting of $GaCl_3$-dialkylimidazolium chloride and a salt of a metal to be codeposited for electrodeposition of gallium-arsenic gallium-antimony or gallium-aluminum. U.S. Pat. No. 5,463,158 to Goledzinowski et al. for "Oligomerization of Low Molecular Weight Olefins in Ambient Temperature Melts" also discloses aluminum and gallium halide and certain organic halides (containing N-heterocyclic rings and substituted onium ions) used to form molten salts in catalytic systems. Molten salts of gallium with certain organic halides have also been reported in S. P. Wicelinski et al., *J. Electrochem. Soc.*, 134:262–263 (1987), "Low Temperature Chlorogallate Molten Salt Systems." These salts apparently display chlorogallate equilibria analogous to that of the chloroaluminates. The $GaCl_3$-MEIC (MEIC, 1-ethyl-3-methylimidazolium chloride, also known as EMIC) and $GaCl_3$-BPC systems (BPC, N-butylpyridinium chloride) are liquid at ambient temperature over a wide range of compositions (S. P. Wicelinski et al., supra) but require the synthesis of the organic chloride salt (J. S. Wilkes et al., *Inorg. Chem.*, 21:1263–1264 (1982), "Dialkylimidazolium Chloroaluminate Melts: A New Class of Room-Temperature Ionic Liquids for Electrochemistry, Spectroscopy and Synthesis"; S. D. Jones and G. E. Blomgren, *J. Electrochem. Soc.*, 136:424–427 (1989), "Low-Temperature Molten Salt Electrolytes Based on Aralkyl Quaternary or Ternary Onium Salts").

A dialkylimidazolium chloride:$InCl_3$ molten salt that melts below 45° C. for a particular basic composition, 45:55 mole % $InCl_3$:RCl, used to electrodeposit mixed InSb films has been reported (M. K. Carpenter and M. W. Verbrugge, U.S. Pat. No. 5,264,111, "Methods of Making Thin InSb Films"); however, to our knowledge ambient temperature molten salts of the form RCl:$InCl_3$ have not been prepared.

Reaction of acidic melts comprising Group III metal halides and organic halide components with ammonia or hydrazine do not appear to have been previously reported.

It is an object of this invention to provide methods for the preparation of precursors to III-V metal compounds (compounds such as AlN having a Group III metal combined with a Group V element) and room-temperature molten salts and methods for solvent-free preparation of such precursors, and also to provide methods for producing such precursors as stable, melt-insoluble compounds that are easy to isolate.

All publications referred to herein are hereby incorporated by reference to the extent not inconsistent herewith.

SUMMARY OF THE INVENTION

Processes are provided for preparation of precursors of III-V compounds, i.e., compounds formed of a Group III metal in combination with a Group V element, preferably nitrogen, wherein said precursors comprise M, X and V, where M is a Group III metal selected from the group consisting of boron, aluminum, gallium, and indium, X is a halide, preferably chloride or bromide and more preferably chloride, and V is a Group V element selected from the group consisting of nitrogen, phosphorous, arsenic, antimony and bismuth. These precursors are easily converted to MV compounds, preferably Group III metal nitrides. Such compounds, especially the nitrides, are useful in the formation of thin films to provide coatings for electronic components and powders for pressing into shapes such as rods, discs and tubes. The precursors are generally in the form of molecules or complexes comprising the Group III metal, nitrogenous moieties or other Group V moieties, and halides, and reference to M, V and X herein refer to these components as they exist in combined rather than elemental form.

The processes comprise: (a) preparing an active halide ion comprising M by forming a mixture of $MX_3$ (a halide of M) with RX' (an organic halide) where R is an asymmetrical organic cation and X' is a halide which may be the same or different from X (the halide of M), wherein said mixture comprises a molar ratio of $MX_3$ to RX' to said organic halide such that said mixture forms a salt comprising an active halide ion comprising M, X and X' which is molten at about 200° C. or less; and (b) contacting said active halide ion with a V-containing material whereby said precursor is formed.

An active halide ion comprising M is a reactive Lewis Acid such as a Group III metal halide having excess halide, $M_2Cl_7^-$, e.g., $B_2Cl_7^-$, $Al_2Cl_7^-$, $Ga_2Cl_7^-$, $In_2Cl_7^-$, or $Al_3Cl_{10}^-$, capable of reacting with V-containing compounds as defined herein, e.g., ammonia or hydrazine, to form stable products which yield III-V compounds upon thermal decomposition.

R is an asymmetrical organic cation preferably containing nitrogen, sulfur or phosphorus, preferably nitrogen. Preferably, R comprises a ring structure, either saturated or unsaturated. More preferably, R comprises an aryl or N-heterocyclic group which is preferably phenyl, pyridyl or imidazoyl. Such rings may be substituted with alkyl, aryl or aralkyl groups. The term "asymmetric" with respect to the organic cation refers to molecules (ions) having no plane of symmetry.

Preferred RX' are asymmetrical molecules selected from the formulae:

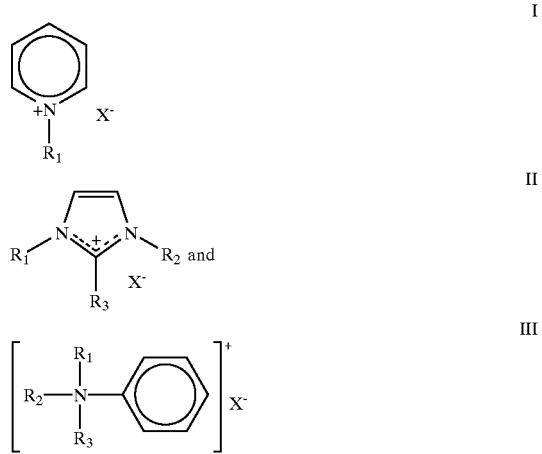

where $R_1$, $R_2$ and $R_3$ are independently H, alkyl or aryl.

Preferably RX' is 1-butylpyridinium chloride (BPC), 1-ethyl-3-methylimidazolium chloride (MEIC or EMIC) or trimethylphenylammonium chloride (TMPACl). TMPACl is commercially available.

A suitable V-containing compound is any such compound capable of providing a V ion having an unshared pair of electrons in the molten salt. Preferably V-containing compounds are nitrogen-containing compounds not containing carbon or oxygen, such as ammonia, hydrazine or an azide such as $NaN_3$ or other Group I metal azide. Other nitrogen-containing compounds such as alkyl-substituted hydrazines, aliphatic and aromatic amines and other nitrogen-containing species such as cyclic aromatic compounds with one or more nitrogen atoms may also be used, but they are less desirable because they do not produce precursors which yield as pure a nitride product upon heating as nitrogen-containing compounds not containing carbon or oxygen.

The molar ratio of $MX_3$ to $RX'$, as well as the specific M, X and R used, helps determine the temperature at which the mixture is molten, as is known to the art or easily ascertainable by those skilled in the art following known analytical procedures for melting point determinations. Equimolar amounts of $AlCl_3$ and RCl form a neutral melt comprising mostly $AlCl_4^-$ which may be liquid at room temperature. Acidic melts also containing $Al_2Cl_7^-$ are formed by adding excess $AlCl_3$. These acidic melts may be liquid at room temperature. The molten salts useful in this invention are low temperature molten salts which are liquid or partly liquid at temperatures below about 200° C. Preferred molten salts useful in this invention are molten salts which are liquid or partly liquid at temperatures below about 100° C., more preferably below about 45° C. and most preferably at ambient temperature or below. "Liquid" salts may be formed by mixing two solids or by heating a single component or mixture of two components above its melting point.

A molar ratio of $MX_3$ to $RX'$ of about 3 to 1 is generally preferred herein. Molar ratios of 2.5:1 and 2:1 are also useful in this invention as are the whole continuum of values between x:1 where $1<x\leq3$. Molar ratios higher than 3:1 $MX_3:RX'$ resulting in mixtures which are partly liquid at low temperatures are also suitable for use in this invention.

The process for making precursor materials of this invention is carried out using a molten salt mixture at an initial temperature below about 200° C., preferably about 100° C. or less, more preferably at about 45° C. or less, and most preferably at ambient temperature or less, in the absence of a solvent. If the molten salt is only partly liquid at the initial reaction temperature, so long as the liquid portion is acidic, the reaction should proceed, with solid $MX_3$ in the reaction vessel going into solution as precursor is formed until the liquid becomes neutral. The reaction may be exothermic, further shifting the reaction equilibrium toward formation of precursor material. Water should be excluded from the reaction vessel.

The precursor produced by the above process is decomposed, preferably by applying heat, to form the corresponding III-V compound. To decompose the precursor, temperatures of between about 200° C. and about 1000° C. may generally be used, preferably between about 800° C. and about 900° C. The precursor material may be heated to vaporize the precursor and deposit the III-V product as a protective film on a desired surface, e.g., that of an aerospace component such as a turbine blade by thermal decomposition. Alternatively, the III-V product may be condensed to form a powder which may be pressed into desired shapes such as crucibles or rods and other structures, preferably with application of heat to anneal the compound, e.g., about 1000° C. to about 1300° C. Use of ammonia as a preferred V-containing material produces precursors especially suitable for decomposition and vaporization of Group III metal nitrides suitable for chemical vapor deposition (CVD) of nitride coatings.

When hydrazine or azide is used as the V-containing material, the precursor forming reaction proceeds at temperatures comparable to those required for ammonia. Hydrazine, which is liquid at room temperature, may be injected via a cannulus into the molten salt and forms a solid, insoluble precursor product with aluminum chloride suggestive of a polymer which can be applied to coat the surface of an object by painting or dipping, or which can be directly cast into desired forms such as rods, etc.

DETAILED DESCRIPTION

Definitions

Figure 1:
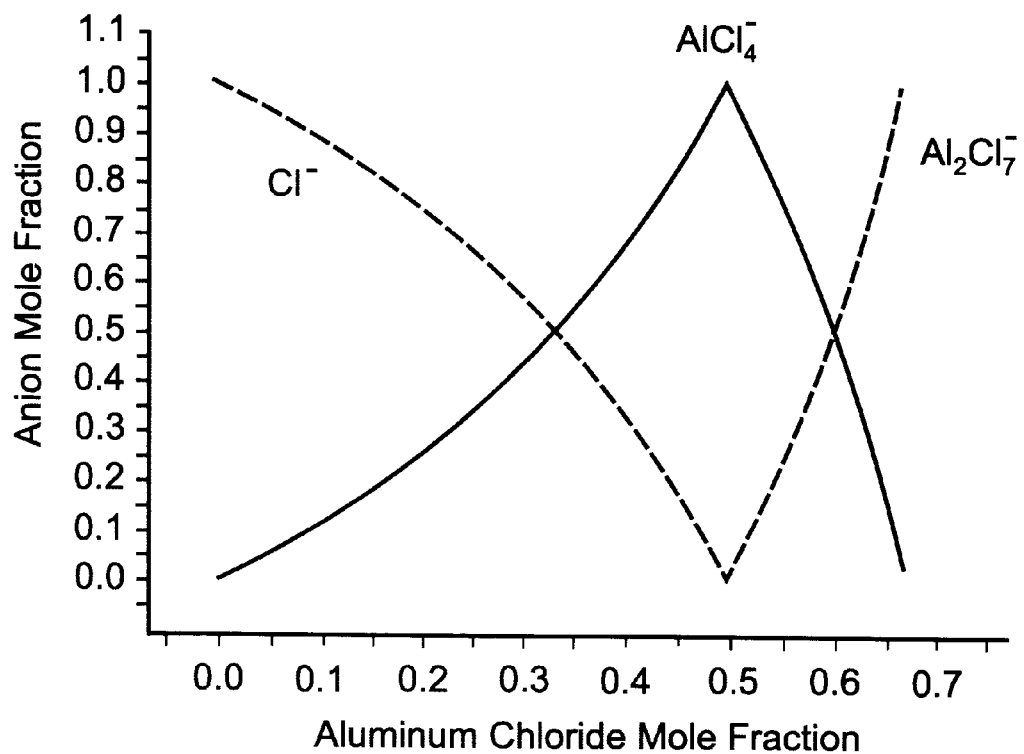
FIG. 1 is a graph showing speciation of chloroacids and bases in an ambient temperature melt comprising 1-ethyl-3-methylimidazolium chloride (MEIC mixed with $AlCl_3$).

A Group III-V compound is a compound composed of a Group III metal chemically combined with a Group V element.

A precursor of a Group III-V compound is a compound capable of decomposing to form a Group III-V compound, usually with the application of heat.

An active metal halide ion is a negatively charged ion of the form $M_2X_7^-$ or $M_3X_{10}^-$, e.g. $Al_2Cl_7^-$ or $Al_3Cl_{10}^-$, capable of acting as a Lewis acid in the molten salt.

A V-containing compound is a compound containing a Group V element, i.e. nitrogen, phosphorous, arsenic, antimony or bismuth, capable of acting as a Lewis base in the molten salt and providing said Group V element as an ion having two unshared electrons.

A molten salt is a salt which is melted, i.e. capable of flowing, and without substantial crystal structure. The term "melt" is used as a synonym for "molten salt."

"Acidic," "basic," and "neutral" as used herein with respect to molten salts refer to the Lewis acid properties of the melt rather than the pH.

Ambient temperature is about 27° C.

An "ambient temperature" or synonymously, "room temperature" molten salt as used herein is a salt which is completely or partly liquid at ambient temperature or below. The term "ambient temperature ionic liquid" is used herein as a synonym for "ambient temperature molten salt."

A "low temperature" molten salt as used herein is one which is liquid or partly liquid at temperatures below about 200° C.

Reference to a reaction being conducted in a molten salt in the "absence of a solvent" means no solvent for the reactants other than the molten salt is present. "Contacting" reaction components with each other refers to providing a medium in which the reaction components are placed together so that they can react with each other.

The term "alkyl" takes its usual meaning in the art and is intended to include straight-chain, branched and cycloalkyl groups. The term includes, but is not limited to, methyl, ethyl, n-propyl, isopropyl, n-butyl, sec-butyl, isobutyl, tert-butyl, n-pentyl, neopentyl, 2-methylbutyl, 1-methylbutyl, 1-ethylpropyl, 1,1-dimethylpropyl, n-hexyl, 1-methylpentyl, 2-methylpentyl, 3-methylpentyl, 4-methylpentyl, 3,3-dimethylbutyl, 2,2-dimethylbutyl, 1,1-dimethylbutyl, 2-ethylbutyl, 1-ethylbutyl, 1,3-dimethylbutyl, n-heptyl, 5-methylhexyl, 4-methylhexyl, 3-methylhexyl, 2-methylhexyl, 1-methylhexyl, 3-ethylpentyl, 2-ethylpentyl, 1-ethylpentyl, 4,4-dimethylpentyl, 3,3-dimethylpentyl, 2,2-dimethylpentyl, 1,1-dimethylpentyl, n-octyl, 6-methylheptyl, 5-methylheptyl, 4-methylheptyl, 3-methylheptyl, 2-methylheptyl, 1-methylheptyl, 1-ethylhexyl, 1-propylpentyl, 3-ethylhexyl, 5,5-dimethylhexyl, 4,4-dimethylhexyl, 2,2-diethylbutyl, 3,3-diethylbutyl, and 1-methyl-1-propylbutyl. Alkyl groups are optionally substituted. Lower alkyl groups are $C_1$–$C_6$ alkyl and include among others methyl, ethyl, n-propyl, and isopropyl groups. Alkyl groups containing up to 16 carbons are contemplated in this invention.

The term "cycloalkyl" refers to alkyl groups having a hydrocarbon ring, particularly to those having rings of 3 to 7 carbon atoms. Cycloalkyl groups include those with alkyl group substitution on the ring. Cycloalkyl groups can include straight-chain and branched-chain portions. Cycloalkyl groups include but are not limited to cyclopropyl, cyclobutyl, cyclopentyl, cyclohexyl, cycloheptyl, cyclooctyl, and cyclononyl. Cycloalkyl groups can optionally be substituted.

The term "unsaturated alkyl" group is used herein generally to include alkyl groups in which one or more carbon-carbon single bonds have been converted to carbon-carbon double or triple bonds. The term includes alkenyl and alkynyl groups in their most general sense. The term is intended to include groups having more than one double or triple bond, or combinations of double and triple bonds. Unsaturated alkyl groups include, without limitation, unsaturated straight-chain, branched or cycloalkyl groups. Unsaturated alkyl groups include without limitation: vinyl, allyl, propenyl, isopropenyl, butenyl, pentenyl, hexenyl, hexadienyl, heptenyl, cyclopropenyl, cyclobutenyl, cyclopentenyl, cyclopentadienyl, cyclohexenyl, cyclohexadienyl, 1-propenyl, 2-butenyl, 2-methyl-2-butenyl, ethynyl, propargyl, 3-methyl-1-pentynyl, and 2-heptynyl. Unsaturated alkyl groups can optionally be substituted.

Substitution of alkyl, cycloalkyl and unsaturated alkyl groups includes substitution at one or more carbons in the group by moieties containing heteroatoms. Suitable substituents for these groups include but are not limited to OH, SH, $NH_2$, COH, $CO_2H$, $OR_c$, $SR_c$, $NR_cR_d$, $CONR_cR_d$, and halogens, particularly chlorines and bromines where $R_c$. and $R_d$, independently, are alkyl, unsaturated alkyl or aryl groups. Preferred alkyl and unsaturated alkyl groups are lower alkyl, alkenyl or alkynyl groups having from 1 to about 3 carbon atoms. Substitution of such groups does not include substitution which would interfere with the ability of RX' to form acidic molten salts with Group III metal halides in which active metal halide ions are produced.

The term "aryl" is used herein generally to refer to aromatic groups which have at least one ring having a conjugated pi electron system and includes without limitation carbocyclic aryl, aralkyl, and heterocyclic aryl, all of which can be optionally substituted. Preferred aryl groups have one or two aromatic rings.

"Carbocyclic aryl" refers to aryl groups in which the aromatic ring atoms are all carbons and includes without limitation phenyl, biphenyl and napthalene groups.

"Aralkyl" refers to an alkyl group substituted with an aryl group. Suitable aralkyl groups include among others benzyl, phenethyl and picolyl, and may be optionally substituted. Aralkyl groups include those with heterocyclic and carbocyclic aromatic moieties.

"Heterocyclic aryl groups" refers to groups having at least one heterocyclic aromatic ring with from 1 to 3 heteroatoms in the ring, the remainder being carbon atoms. Suitable heteroatoms include without limitation oxygen, sulfur, and nitrogen. Heterocyclic aryl groups include among others furanyl, thienyl, pyridyl, pyrrolyl, N-alkyl pyrrolo, pyrimidyl, pyrazinyl, imidazolyl, benzofuranyl, quinolinyl, and indolyl, all optionally substituted.

Aryl group substitution includes substitutions by non-aryl groups (excluding H) at one or more carbons or where possible at one or more heteroatoms in aromatic rings in the aryl group. Unsubstituted aryl, in contrast, refers to aryl groups in which the aromatic ring carbons are all substituted with H, e.g. unsubstituted phenyl (—$C_6H_5$), or napthyl (—$C_{10}H_7$). Suitable substituents for aryl groups include among others, alkyl groups, unsaturated alkyl groups, halogens, OH, SH, $NH_2$, COH, $CO_2H$, $OR_e$, $SR_e$, $NR_eR_f$, $CONR_eR_f$, where $R_e$ and $R_f$ independently are alkyl, unsaturated alkyl or aryl groups. Preferred substituents are OH, SH, $OR_e$, and $SR_e$, where $R_e$ is a lower alkyl, i.e. an alkyl group having from 1 to about 3 carbon atoms. Other preferred substituents are halogens, more preferably chlorine or bromine, and lower alkyl and unsaturated lower alkyl groups having from 1 to about 3 carbon atoms. Substituents include bridging groups between aromatic rings in the aryl group, such as —$CO_2$—, —CO—, —O—, —S—, —NH—, —CH=CH— and —$(CH_2)_l$– where l is an integer from 1 to about 5, and particularly —$CH_2$—. Examples of aryl groups having bridging substituents include phenylbenzoate. Substituents also include moieties, such as —$(CH_2)_l$—, —O—$(CH_2)_l$— or —OCO—$(CH_2)_l$—, where l is an integer from about 2 to 7, as appropriate for the moiety, which bridge two ring atoms in a single aromatic ring as, for example, in a 1,2,3,4-tetrahydronaphthalene group. Alkyl and unsaturated alkyl substituents of aryl groups can in turn optionally be substituted as described supra for substituted alkyl and unsaturated alkyl groups.

The terms "alkoxy group" and "thioalkoxy group" (also known as mercaptide groups, the sulfur analog of alkoxy groups) take their generally accepted meaning. Alkoxy groups include but are not limited to methoxy, ethoxy, n-propoxy, isopropoxy, n-butoxy, sec-butoxy, isobutoxy, tert-butoxy, n-pentyloxy, neopentyloxy, 2-methylbutoxy, 1-methylbutoxy, 1-ethyl propoxy, 1,1-dimethylpropoxy, n-hexyloxy, 1-methylpentyloxy, 2-methylpentyloxy, 3-methylpentyloxy, 4-methylpentyloxy, 3,3-dimethylbutoxy, 2,2-dimethoxybutoxy, 1-1-dimethylbutoxy, 2-ethylbutoxy, 1-ethylbutoxy, 1,3-dimethylbutoxy, n-pentyloxy, 5-methylhexyloxy, 4-methylhexyloxy, 3-methylhexyloxy, 2-methylhexyloxy, 1-methylhexyloxy, 3-ethylpentyloxy, 2-ethylpentyloxy, 1-ethylpentyloxy, 4,4-dimethylpentyloxy, 3,3-dimethylpentyloxy, 2,2-dimethylpentyloxy, 1,1-dimethylpentyloxy, n-octyloxy, 6-methylheptyloxy, 5-methylheptyloxy, 4-methylheptyloxy, 3-methylheptyloxy, 2-methylheptyloxy, 1-methylheptyloxy, 1-ethylhexyloxy, 1-propylpentyloxy, 3-ethylhexyloxy, 5,5-dimethylhexyloxy, 4,4-dimethylhexyloxy, 2,2-diethylbutoxy, 3,3-diethylbutoxy, 1-methyl-1-propylbutoxy, ethoxymethyl, n-propoxymethyl, isopropoxymethyl, sec-butoxymethyl, isobutoxymethyl, (1-ethyl propoxy)methyl, (2-ethylbutoxy)methyl, (1-ethylbutoxy)methyl, (2-ethylpentyloxy)methyl, (3-ethylpentyloxy)methyl, 2-methoxyethyl, 1-methoxyethyl, 2-ethoxyethyl, 3-methoxypropyl, 2-methoxypropyl, 1-methoxypropyl, 2-ethoxypropyl, 3-(n-propoxy)propyl, 4-methoxybutyl, 2-methoxybutyl, 4-ethoxybutyl, 2-ethoxybutyl, 5-ethoxypentyl, and 6-ethoxyhexyl. Thioalkoxy groups include but are not limited to the sulfur analogs of the alkoxy groups specifically listed supra.

"Optional" or "optionally" means that the subsequently described event or circumstance may or may not occur, and that the description includes instances where said event or circumstance occurs and instances in which it does not. For example, "optionally substituted phenyl" means that the phenyl radical may or may not be substituted and that the description includes both unsubstituted phenyl radicals and phenyl radicals wherein there is substitution.

A method is provided for room temperature preparation of stable precursors to III-V compounds, preferably nitrides such as AlN, GaN and InN. The invention is exemplified by: (1) preparation of molten salts, preferably acidic molten salts, comprising a group (III) trihalide (e.g., $AlCl_3$, $GaCl_3$, $InCl_3$ and $BCl_3$) and an organic halide, preferably chloride, exemplified herein by trimethylphenylammonium chloride (TMPACl); (2) reaction of the acidic molten salt with a Group V element-containing base which is preferably oxygen- and carbon-free, e.g. ammonia or hydrazine or an azide such as $NaN_3$, to form a stable precursor material which can be thermally decomposed to the corresponding nitride.

This invention takes advantage of the Lewis acid-base properties of the molten salt to exothermically form a convenient preceramic material. Since the molten salt is liquid, preferably at room temperature or at a mild super-ambient temperature, i.e., about 45° C., or in other embodiments about 200° C., no solvent is required to perform the reaction which forms the ceramic precursor.

The molten salts are composed of an organic halide, RX', where R is an asymmetrical cation, preferably 1-ethyl-3-methylimidazolium ($MEI^+$ also referred to as $EMI^+$) (J. S. Wilkes et al., *Inorg. Chem.*, 21:1263–1264 (1982), "Dialkylimidazolium Chloroaluminate Melts: A New Class of Room-Temperature Ionic Liquids for Electrochemistry, Spectroscopy, and Synthesis"), 1-butylpyridinium ($BP^+$) (J. Robinson and R. A. Osteryoung, *J Am. Chem. Soc.*, 101:323–327 (1979), "An Electrochemical and Spectroscopic Study of Some Aromatic Hydrocarbons in the Room Temperature Molten Salt System Aluminum Chloride-n-Butylpyridinium Chloride"), or trimethylphenylammonium ($TMPA^+$) (S. D. Jones and G. E. Blomgren, *J Electrochem. Soc.*, 136:424–427 (1989), "Low-Temperature Molten Salt Electrolytes Based on Aralkyl Quaternary or Ternary Onium Salts") halide mixed with a group III trihalide ($MX_3$).

In preferred embodiments of this invention, M is selected from the group consisting of Al, Ga and In, preferably Al, and X is preferably $Cl^-$, although analogous chemistry is possible for other halide salts, such as $Br^-$ salts, as well. Typically the same halide is used for both RX' and $MX_3$, but this is not necessary. The nature of the organic cation and the halides affects the ambient temperature liquid range of compositions, eutectic compositions, electrochemical characteristics of the melt including cathodic and anodic potential limits, viscosity, conductivity, and the like (R. A. Osteryoung in *Molten Salt Chemistry*, G. Mamantov and R. Marassi (Eds.), NATO ASI Series C, Volume 202, D. Reidel Publishing Co., Dordrecht, Netherlands (1987) 329–364, "Organic Chloroaluminate Ambient Temperature Molten Salts"; A. A. Fannin et al., *J Phys. Chem.*, 88:2614–2621 (1984), "Properties of 1,3-Dialkylimidazolium Chloride—Aluminum Chloride Ionic Liquids. 2. Phase Transitions, Densities, Electrical Conductivities, and Viscosities").

The salts are prepared by mixing together the solid RX' and $MX_3$:

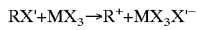

(When X' is the same as X, $MX_3X'^-$ becomes $MX_4^-$.) If the mixture forms a liquid at ambient temperature or below over some composition range $MX_3$:RX' (denoting mole fractions of the components), then the material is called an ambient temperature molten salt. For this invention, ambient temperature melts are preferred, but any Group III metal-containing molten salt which melts at a reasonably low temperature, e.g., less than or equal to about 200° C., more preferably less than or equal to about 45° C., and contains active metal halide ions, e.g., $AlCl_4^-$, $Al_2Cl_7^-$ and $Al_3Cl_{10}^-$, will be useful. Similar chemistry as described here also arises from higher temperature systems such as NaCl—$AlCl_3$ or molten $AlCl_3$, but these are not preferred conditions because of safety and containment considerations. The $AlCl_3$:TMPACl system is used as an example herein. The formation of this molten salt corresponds to:

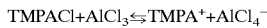

Because of the presence of $AlCl_3$, melts exhibit Lewis acid-base solvolysis equilibrium between basic chloride ($Cl^-$) and acidic heptachlorodialuminate ($Al_2Cl_7^-$):

$K_{eq}$ is about $10^{-17}$ at room temperature for the $AlCl_3$:MEIC system (A. A.Fannin et al., *J Phys. Chem.*, 88:2614–2621 (1984), "Properties of 1,3-Dialkylimidazolium Chloride—Aluminum Chloride Ionic Liquids. 2. Phase Transitions, Densities, Electrical Conductivities, and Viscosities"). The exact value depends on the nature of constituents mixed. Compositions are commonly designated by specification of the mole fractions of $AlCl_3$ and TMPACl in the mixture. For example, a molten salt formed by mixing equimolar amounts of $AlCl_3$ and RCl forms a neutral melt, 0.5:0.5 $AlCl_3$:RCl. Here, virtually all chloroaluminate exists as $AlCl_4^-$. Acidic melts containing $AlCl_4^-$ and $Al_2Cl_7^-$ are formed by mixtures containing excess $AlCl_3$. Basic melts containing $AlCl_4^-$ and $Cl^-$ are formed by adding excess organic chloride. Not all compositions of the binary mixture are necessarily liquid at room temperature. For example, for the $AlCl_3$:TMPACl system, only acidic compositions melt at or below room temperature (S. D. Jones and G. E. Blomgren, *J Electrochem. Soc.*, 136:424–427 (1989), "Low-Temperature Molten Salt Electrolytes Based on Aralkyl Quaternary or Ternary Onium Salts"). Other formulations have different liquid ranges. When RX' is MEIC and M is Al, the melts are liquid over a wide range of RCl:$AlCl_3$ ratios and basic and neutral as well as acidic melts are liquid at room temperature. When RX' is BPC, higher than ambient temperatures are required. When RX' is TMPACl, acidic melts are liquid, but neutral and basic melts are solid at room temperature. Acidic melts containing the strong Lewis acid $Al_2Cl_7^-$ or in general $M_2Cl_7^-$, where M is Al, Ga, In or B (Group III metals) are preferred for use in this invention. Neutral and basic melt compositions are less preferred for the methods described herein. When R is a quinone, neutral melts tend to be active, especially if the ratio of RX':$MX_3$ is increased and/or heat is applied. The dependence of speciation of aluminates in the case of an $AlCl_3$:RCl melt are shown in FIG. 1.

The general method of precursor preparation exemplified here takes advantage of the high reactivity of the Lewis acid $M_2Cl_7^-$ (for example, $Al_2Cl_7^-$, or equivalently $Ga_2Cl_7^-$ or $In_2Cl_7^-$) with nitrogenous bases such as ammonia ($NH_3$) or hydrazine ($N_2H_4$) to form stable products which yield the nitrides upon thermal decomposition. The strong tendency of, for example, $Al_2Cl_7^-$ to react with a base such as $NH_3$ or $N_2H_4$:

or

drives formation of materials of the proper stoichiometry to form aluminum nitride. These reactions are written to emphasize the acid-base nature of the chemical driving force. They are not necessarily mechanistically accurate. Lewis acid-base adduct formation in ambient temperature chloroaluminate melts has been described and written formally in this notation for quinones (G. Cheek and R. A. Osteryoung, *J Electrochem. Soc.*, 129:2739–2745 (1982), "An Electrochemical and Infrared Study of Chloranil in n-Butylpyridinium Chloride:Aluminum Chloride Ionic Liquid") and amines (S.-G. Park et al., *J Am. Chem. Soc.*, 113:3334–3340 (1991), "A Mixed Lewis Acid-Bronsted Acid Ambient Temperature Ionic Liquid: An Electrochemical and NMR Study of Dimethylaniline").

An additional advantageous feature of the invention is the use of Group V bases such as $NH_3$ and $N_2H_4$ which contain no carbon or oxygen and therefore form carbide- and oxide-free ceramics. Alkyl-substituted hydrazines, aliphatic and aromatic amines and other Group V element-containing species react similarly but are less desirable since they contain carbon and/or oxygen in their molecular structure.

When $NH_3$ is used, the precursor material may be readily volatized. Nonvolatile or reduced-volatility precursors to AlN based on room temperature chloroaluminate ionic liquid chemistry can be produced using hydrazine. These precursors are polymeric materials suitable for applications including thin films, protective thick film coatings and bulk powders. The reaction of hydrazine ($N_2H_4$) with an acidic chloroaluminate melt is shown below:

tions of the molten salts effect reaction, although less acidic compositions give a lower yield.

The method yields easily handled bulk compounds which can be thermally decomposed to the corresponding III-V compound.

EXAMPLES

Example 1
Reaction of an Acidic $AlCl_3$:TMPACl melt with $NH_3$

Figure 2:
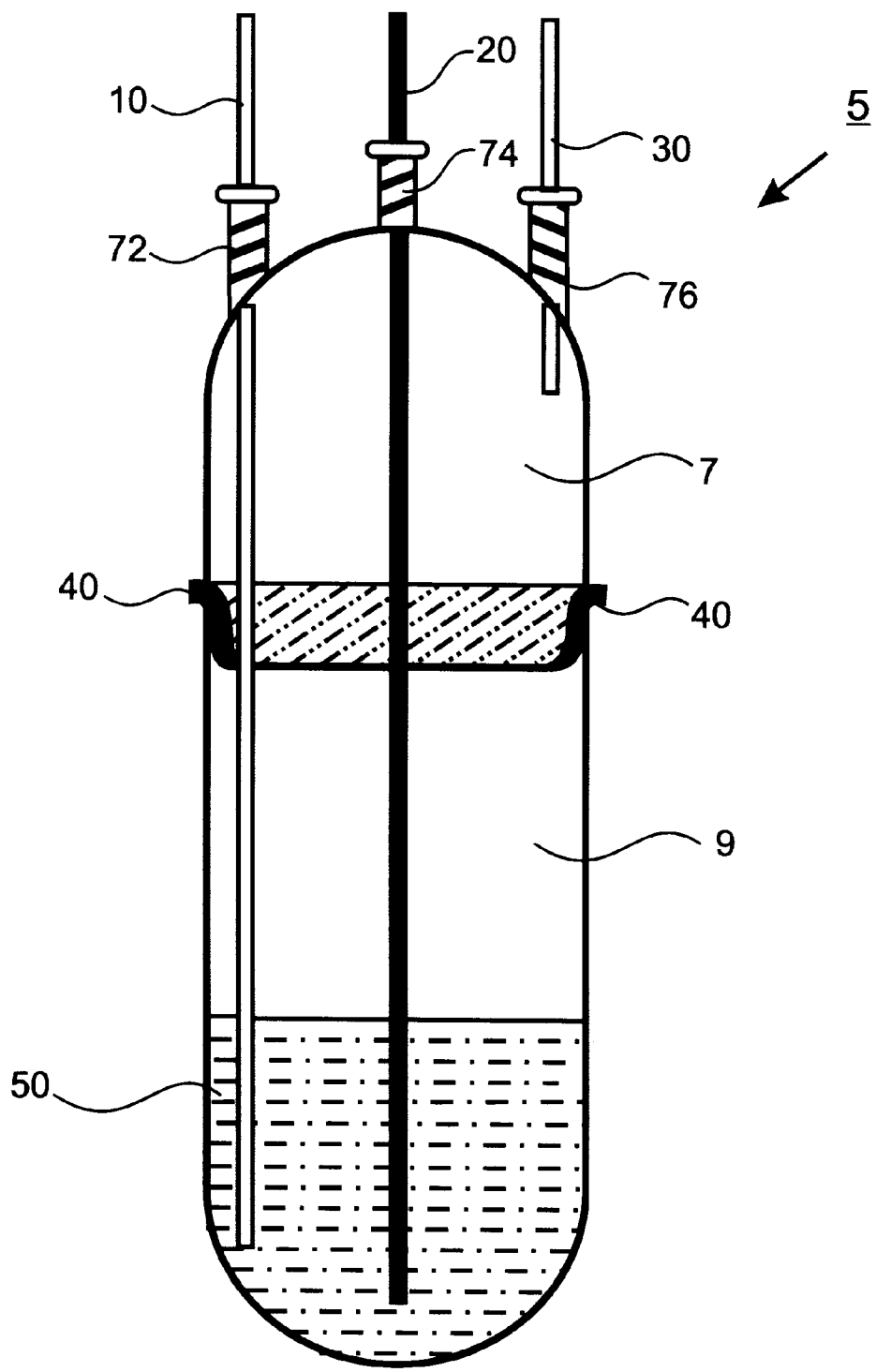
FIG. 2 shows the design of a reactor used for reaction of acidic aluminum chloride-trimethylphenylammonium chloride ($AlCl_3$:TMPACl) molten salt with ammonia.

An ambient temperature molten salt composed of $AlCl_3$ and TMPACl was prepared with an $AlCl_3$:TMPACl ratio of 0.67:0.33. Approximately 100 mL of melt was placed in a sealed reactor 5 having a top 7 and a bottom 9 fitted together by means of a ground glass joint 40. The reactor 5 is fitted with gas inlets and outlets and a thermocouple temperature probe as shown in FIG. 2. A molten salt 50 is placed in the bottom of the reactor. Inlet tube 10 extends down through first threaded glass joint 72 into the molten salt 50, whereby nitrogen or ammonia gas may be fed in to the reactor 5 to contact the molten salt 50. A thermocouple 20 to monitor the temperature of the reaction also extends from the molten salt 50 up through the second threaded glass joint 74 and out of the reactor 5. Gaseous reaction products, if generated, exit through vent tube 30.

The reactor was assembled and filled inside an inert atmosphere drybox, then transferred to a hood, where it was connected to ammonia and inert gas supplies and placed in a water bath. Ammonia was introduced into the reactor (flow rate not controlled) for several minutes. During this time the temperature inside the cell rose from 25° C. to 60° C. If a bath was not used, the temperature rose rapidly to about 125–130° C. in less than one minute. Shortly after commencing ammonia flow, solid material began to form in the melt. Eventually, this solid filled the reactor. Reaction was typically stopped when the interior of the reactor was completely filled with solid product and the melt temperature began to drop. Residual melt components in the bottom of the reactor solidified as the temperature returned to the ambient value. Adduct formation reaction consumes $AlCl_3$, with change in composition of the melt toward the neutral point. Once the neutral composition is reached, reaction ceases. The neutral composition of the system in this

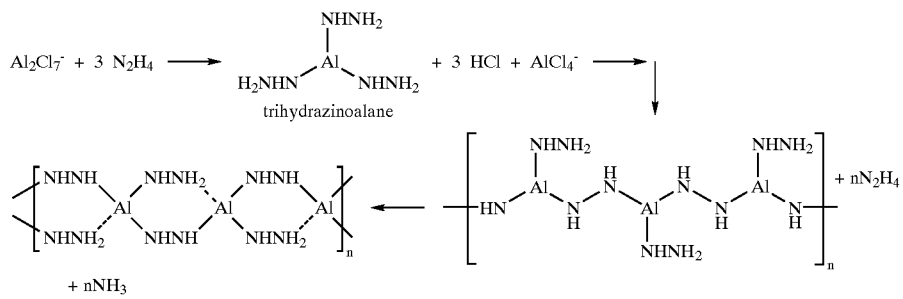

This reaction produces oligomers and polymers by analogy to reactions of $AlCl_3$ with hydrazine. The trihydrazinoalane intermediate is unstable, polymerizing via the route shown above.

The method does not require a solvent, further simplifying preparation. However, a solvent may be used if desired, e.g., to affect viscosity. Highly reactive chloroacids, $M_2Cl_7^-$, eliminate the need to perform a high temperature gas phase reaction to form the nitride precursor. All acidic composiexample melts at 50° C. (S. D. Jones and G. E. Blomgren (1989), supra.) The white solid material from the reactor was collected. The melting point of the product was about 80° C. at 1 atm. The solid material collected from the ammonia reaction could be vaporized at 100° C. and 1 torr. This allowed a simple route to purification by vaporization followed by collection on a cold finger.

Figure 3A:
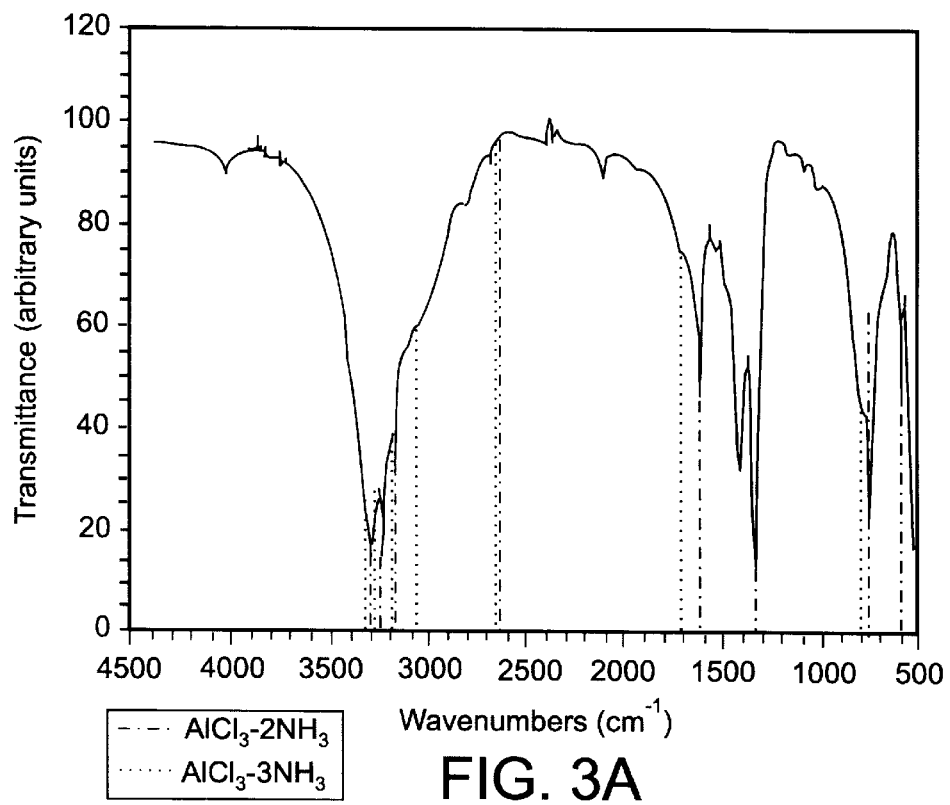
FIG. 3A shows the FT-IR spectrum of the reaction product between an $AlCl_3$:TMPACl molten salt at a ratio of 0.67:33 and ammonia following purification.
Figure 3B:
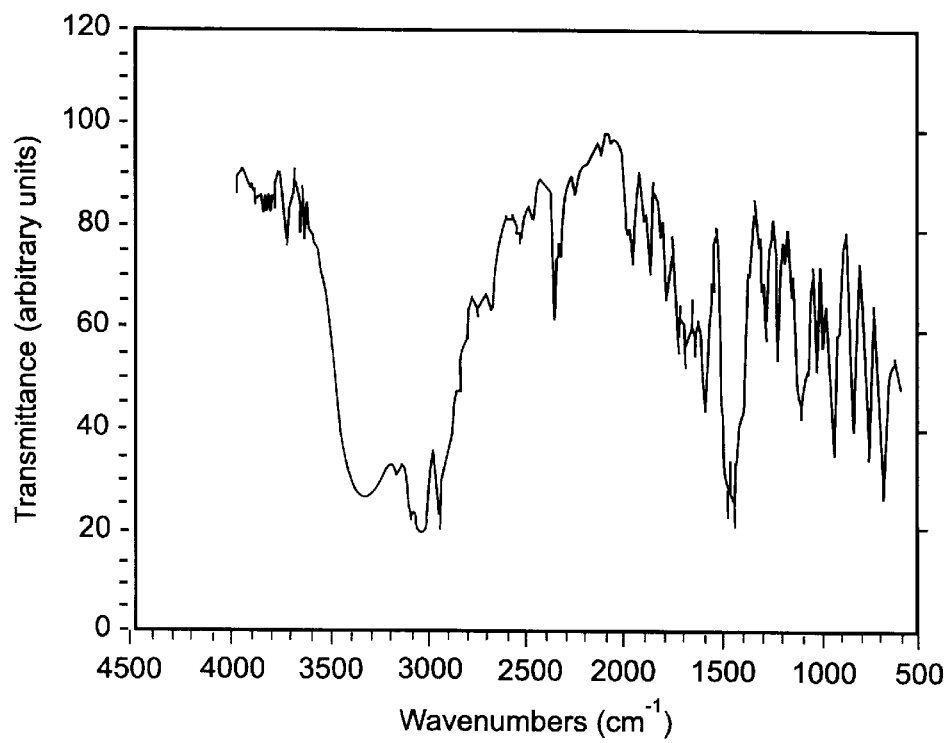
FIG. 3B shows the FT-IR spectrum of the molten salt.

The infrared spectrum of purified $AlCl_3(NH_3)_{1-3}$ precursor product and starting melt are shown in FIGS. 3A and 3B respectively. The spectrum of vapor phase purified product corresponds quite well with AlCl$_3$(NH$_3$)$_2$ (H. Jacobs and B. Nöcker, Z. Anorg. Allg. Chem., 614:25–29 (1992), "AlCl$_3$.2NH$_3$—a Compound with the Crystal Structure of a Tetraamine Dichloroaluminiumtetrachloroaluminate— [AlCl$_2$(NH$_3$)$_4$]+[AlCl$_4$]−") and AlCl$_3$(NH$_3$)$_3$ (H. Jacobs and B. Nöcker, Z. Anorg. Allg. Chem., 619:73–76 (1993), "AlCl$_3$.2NH$_3$—a Compound with the Crystal Structure of a Tetraammine Dichloro Aluminium-Diammine Tetrachloro Aluminate: [AlCl$_2$(NH$_3$)$_4$]+[AlCl$_4$(NH$_3$)$_2$]−"). The spectrum of the 1:1 compound AlCl$_3$(NH$_3$) (D. W. Lewis, J Electroc. Soc., 117:978–982 (1970), "Properties of Aluminum Nitride Derived from AlCl$_3$.NH$_3$") is not available but the results shown in FIGS. 3A and 3B do not necessarily preclude its existence in the reaction product. Notably absent from the product spectrum are C—C and C—H absorptions from TMPACl in the melt (FIG. 3B), indicating substantial removal of residual melt from the product by a one step purification. Purification of the product is also indicated by conventional elemental analysis (Table 1). The stoichiometry of the pure material by this method is 1:1 or 1:2 AlCl$_3$:NH$_3$. We conclude that the product of this reaction is AlCl$_3$(NH$_3$)$_x$ where 1<X<3, i.e., a mixture of ammoniates. The overall reaction may then be given as

TABLE 1

Elemental Analysis for Crude and Purified Aluminum Chloride Ammoniate Compounds, AlCl$_3$(NH$_3$)$_x$ Obtained from Reaction of an Acidic Chloroaluminate Melt with Ammonia

| Element | % crude[a] | % pure[b] | Calc 1:1[c] | Calc 1:2 | Calc 1:3 | Calc 1:6 |
|---|---|---|---|---|---|---|
| Al | 12.4 ± 0.2 | 17 ± 2 | 17.9 | 16.1 | 14.6 | 11.5 |
| N | 6.8 | 11.4 | 9.3 | 16.7 | 22.8 | 35.7 |
| Cl | 53.2 | 69.4 | 70.7 | 63.5 | 57.7 | 45.2 |
| C | 27.1 ± 0.1 | 1.7 ± 1.3 | — | — | — | — |

[a]% crude:atomic percent for crude product.
[b]% pure:atomic percent for purified product; error ranges are ±2σ where values from replicate determinations were available; % pure values were corrected for 6% loss of material after analysis, probably due to volatility of the AlCl$_3$(NH$_3$)$_x$ adduct.
[c]calc 1:1, calc 1:2, etc. represent theoretical atomic percent values for adducts of the form AlCl$_3$(NH$_3$)$_x$, where x is 1, 2, 3 or 6.

Example 2
Chemical Vapor Deposition of AlN from a Molten Salt-Derived Precursor

Figure 4:
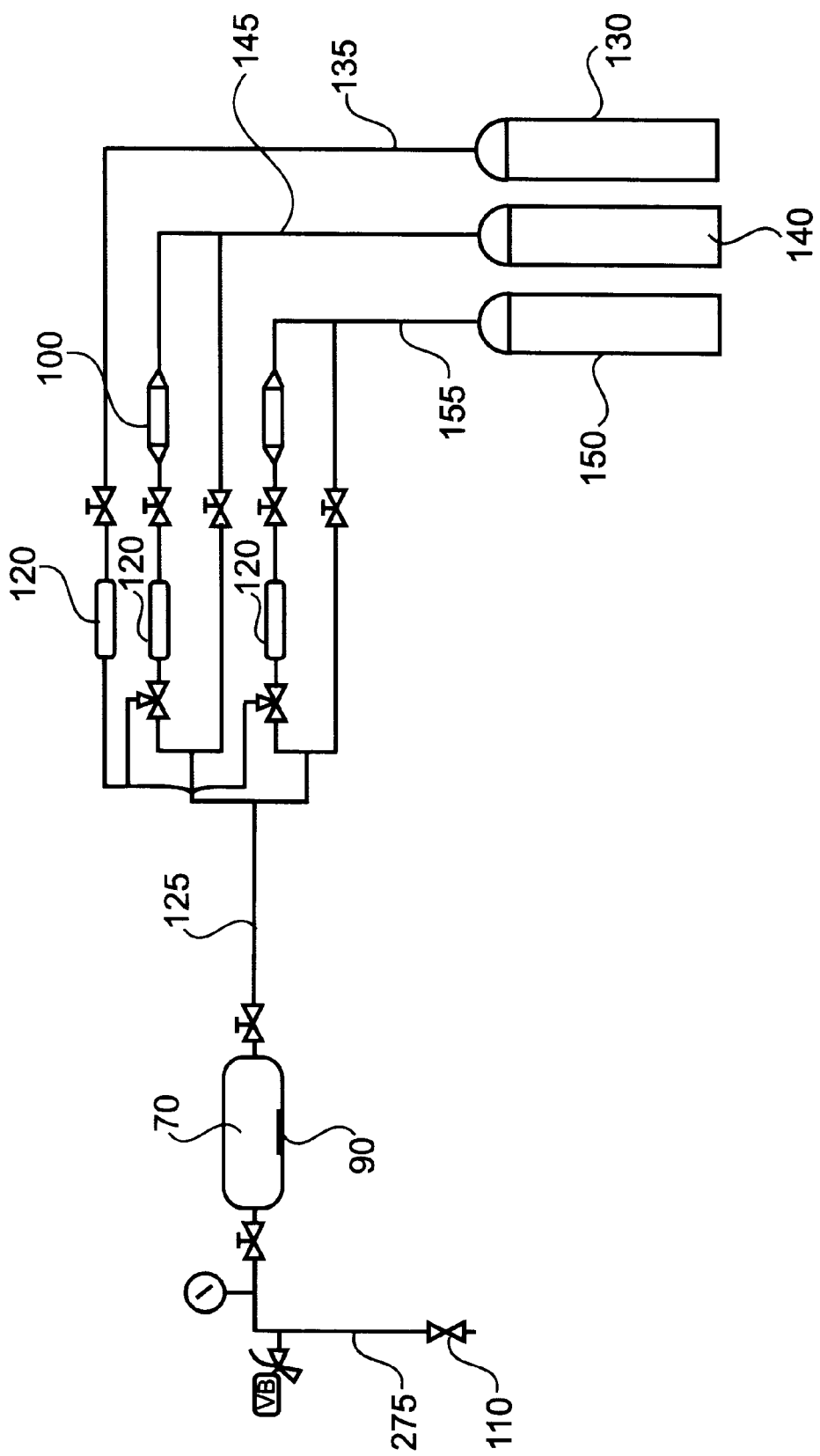
FIG. 4 shows the design of a chemical vapor deposition (CVD) apparatus used for nitride film preparation.
Figure 5:
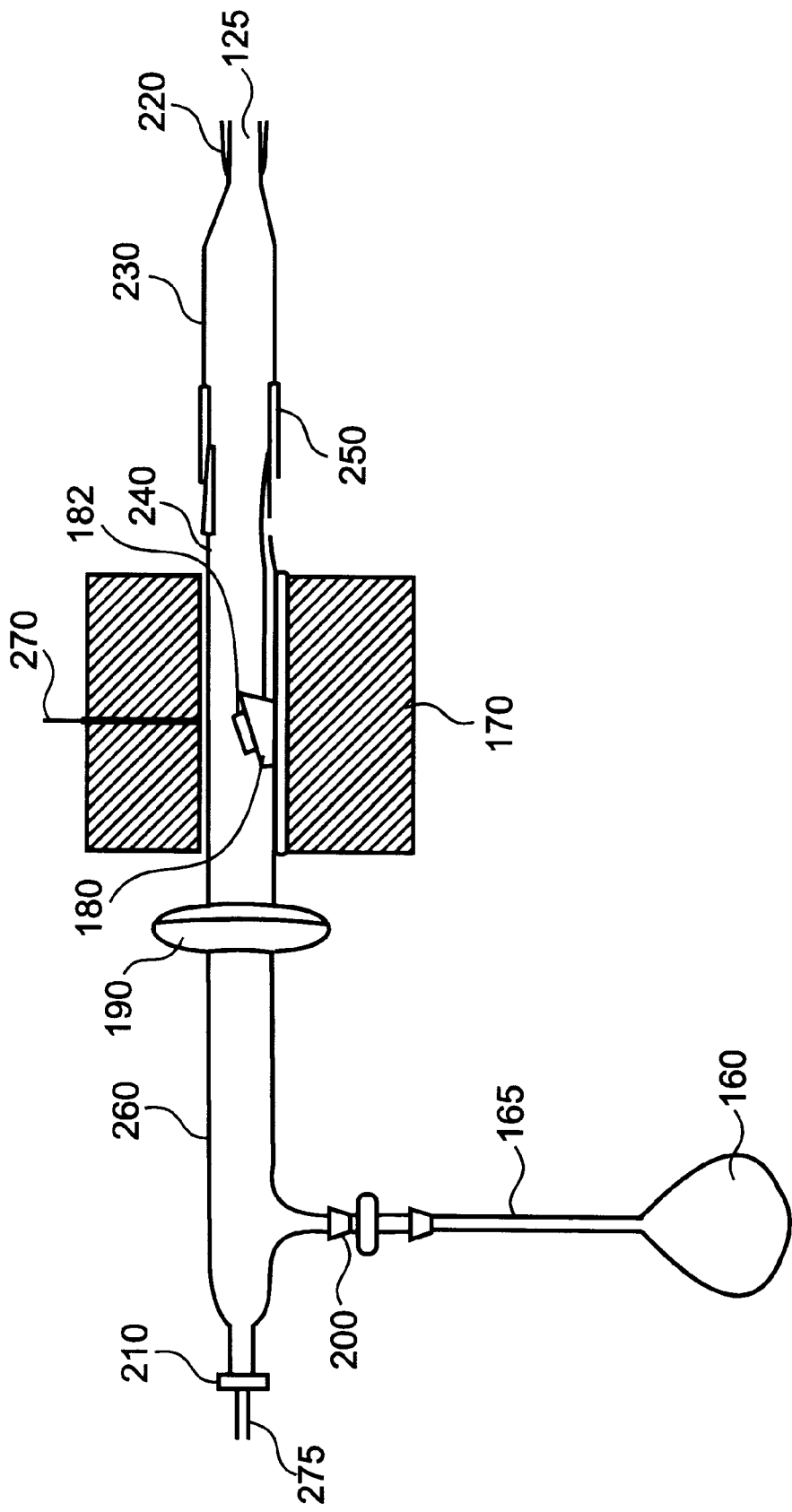
FIG. 5 shows details of precursor introduction and the decomposition zone of the apparatus of FIG. 4.

The volatile precursor obtained by reaction of acidic melt with NH$_3$ described in Example 1 was used to perform chemical vapor deposition of thin AlN films. A schematic of the CVD reactor is shown in FIGS. 4 and 5. Hydrogen, argon and nitrogen from hydrogen source 130, argon source 140 and nitrogen source 150 are flowed through hydrogen line 135, argon line 145 and nitrogen line 155 respectively through valved lines comprising oxygen and water scrubbers 100 and mass flow controllers 120, and mixed for flowing into combined gas line 125 to removable decomposition chamber 70 equipped with substrate heater 90. Spent gases exit through exhaust line 275 through valve 110 to traps and vacuum, all as shown in FIG. 4.

FIG. 5 shows detail of the precursor introduction and decomposition zone of the CVD apparatus of FIG. 4. Combined gas line 125 is equipped with rubber vacuum hose 220 receiving first Pyrex tube 230, connected via joint 250 which is a ground glass joint to quartz tube 240 leading into tube furnace 170 equipped with thermocouple 270. Quartz tube 240 contains substrate holder 180 on which substrate 182 , e.g., a 1"×1" quartz plate, is placed. Quartz tube 240 leads out of tube furnace 170, connecting via O-ring ring joint 190 made of Viton™ to second Pyrex tube 260. Precursor pot 160 holds precursor material which enters second Pyrex tube 260 via line 165 connected via ground glass stopcock and joints 200, and enters tube furnace 170. Second Pyrex tube 260 connects via joint 210 which is a Swagelock™ joint with a Teflon™ ferrule set, to stainless steel exhaust line 275.

Precursor material was vaporized at 190° C. from a precursor pot 160 connected to the main reactor tube 260. The system was maintained at 1–2 Torr during CVD. N$_2$ carrier gas from nitrogen source 150 was flowed into nitrogen line 155 at 10–25 sccm flow rate. Typically, the temperature of the CVD decomposition chamber 70 at the position of the substrate was 850–900° C. AlN depositions were carried out on both quartz and Si(111) substrates.

Figure 8:
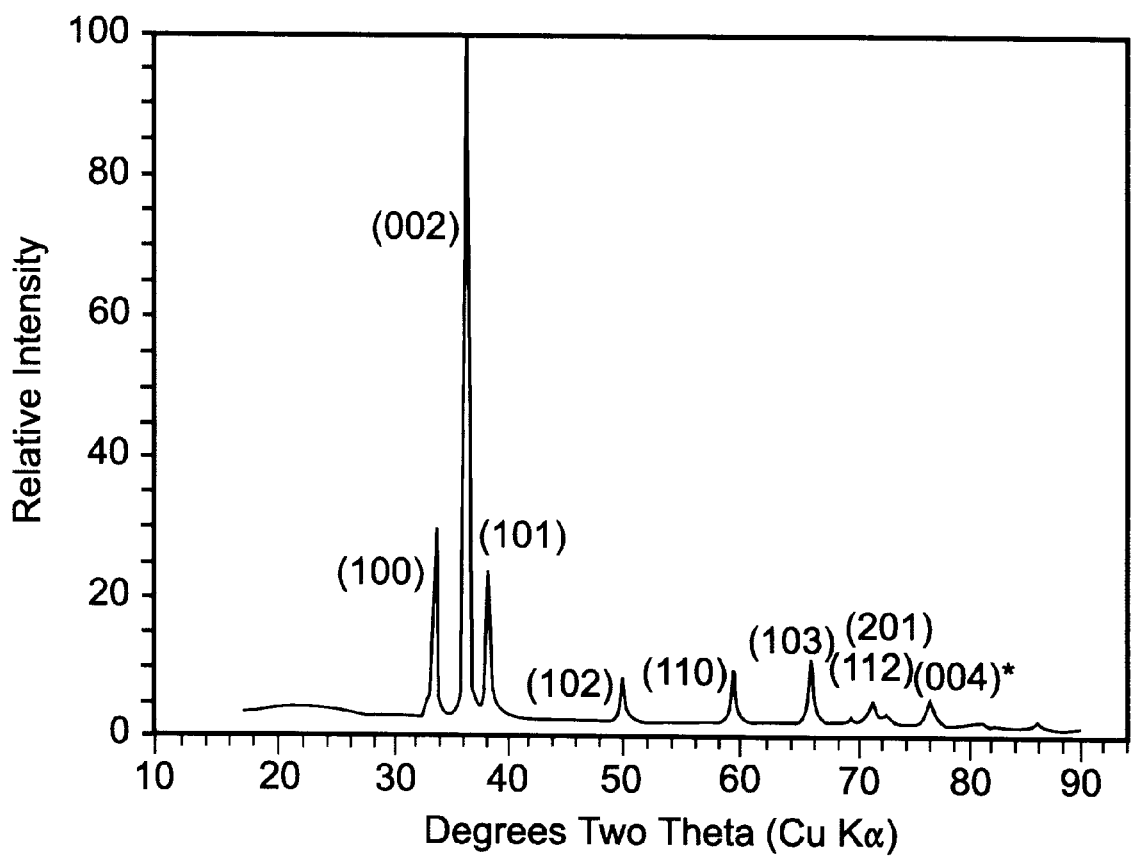
FIG. 8 is an X-ray diffraction pattern for an aluminum nitride film deposited on quartz by CVD using $AlCl_3(NH_3)_{1-3}$ at 900° C.
Figure 9:
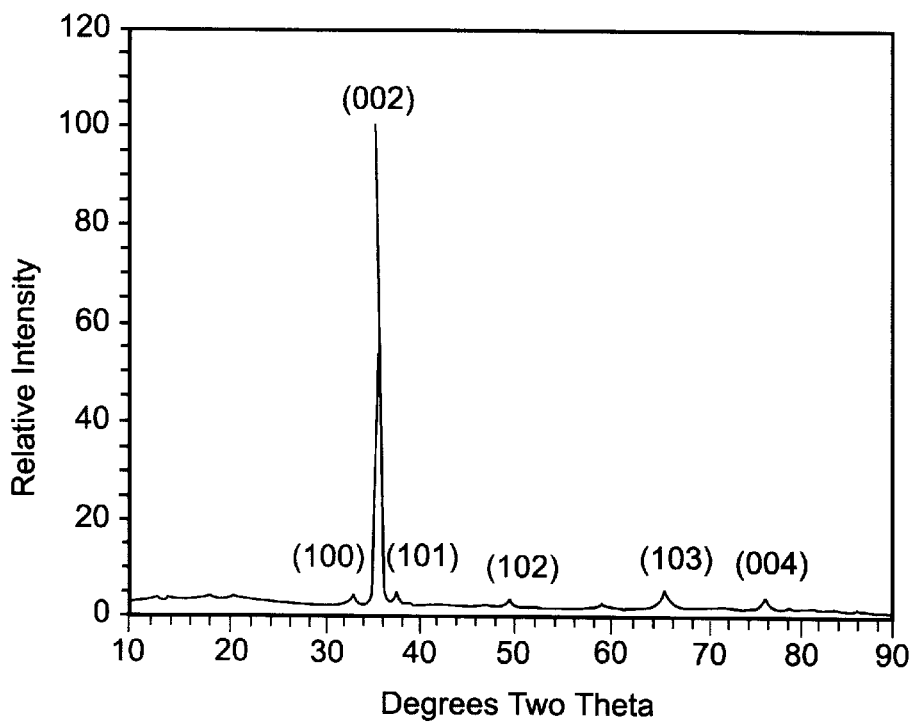
FIG. 9 is an X-ray diffraction pattern for an aluminum nitride film deposited on quartz at 850° C. by CVD of $AlCl_3(NH_3)_{1-3}$.

A number of CVD experiments were performed using the AlCl$_3$(NH$_3$)$_{1-3}$ material, with XRD analyses of the resulting films. A Rigaku Miniflix X-ray diffractometer using Cu Kα radiation was used. Data were acquired at 2 degrees per minute. FIG. 8 shows X-ray diffraction (XRD) results for a CVD run performed on a quartz substrate at 900° C. All features of the XRD spectrum could be assigned to AlN indices (K. G. Nickel et al., J. Am. Ceram. Soc., 72:1804 (1989); M. Akiyama et al., J. Am. Ceram. Soc., 78:3304 [1995]). The spectrum corresponded predominately to randomly oriented, polycrystalline AlN (K. G. Nickel et al., J. Am. Ceram. Soc., 72:1804 [1989]), with a slight preference for the (002) orientation. When the CVD deposition temperature was lowered to 850° C. (N$_2$ carrier gas at 25 sccm and 1.2 Torr), using a quartz substrate, the XRD results shown in FIG. 9 were obtained. All peaks could be assigned to AlN indices, but there was a strong preferential orientation in the (002) direction.

Figure 10:
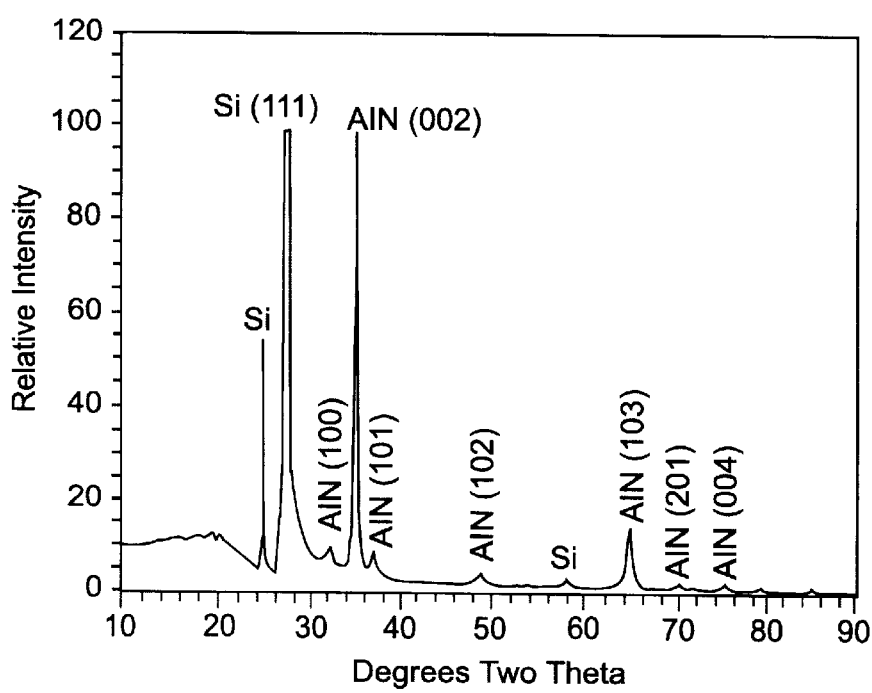
FIG. 10 is an X-ray diffraction pattern for an aluminum nitride film grown on Si(111) at 850° C. by CVD of $AlCl_3(NH_3)_{1-3}$.

An example of CVD performed on Si(111) was performed at 850° C. as described above for quartz. The Si(111) surface was cleaned by etching for 90 seconds in 10% HF. After placing the Si substrate in the CVD reactor, oxide was removed by baking at 600° C. for one hour in a stream of 10% H$_2$ in N$_2$. XRD results are shown in FIG. 10. XRD results for all CVD runs confirm that thermal decomposition of precursor materials obtained by reaction of melt with ammonia produces AlN. We observed no evidence of substantial carbide or oxide in these XRD patterns.

Figure 6:
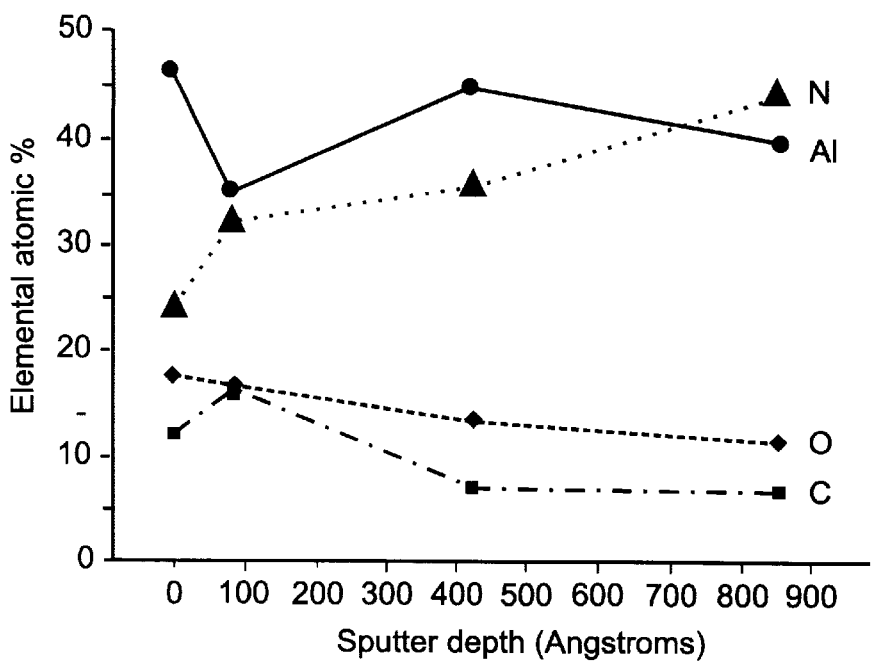
FIG. 6 shows the results of Auger Electron Spectroscopy depth profiling of a film of AlN formed by chemical vapor deposition (CVD) on quartz.

Auger Electron Spectroscopy (AES) was done on the thin films deposited on quartz and Si(111) at Rocky Mountain Laboratories, Golden, Colo. The as-received surface revealed the presence of Al and N as expected, in addition to carbon and oxygen. After Ar+ etching to a depth of 850 Å, carbon and oxygen were mostly absent. Background noise in AES results after Ar+ etching was larger compared to results from the as-received surface because of charging of the AlN sample during analysis. This may be taken as a positive sign of the purity of the AlN produced. A summary of the results of depth profiling of the AlN/Si(111) sample are shown in FIG. 6. Because of sample charging, sputter depths are approximate. The AES data indicate Al:N ratio very close to 1:1 throughout most of the profiled depth of the film, with carbon and oxygen contamination decreasing toward the interior. Carbon and oxygen contamination was most likely introduced during CVD, or during sample storage.

Figure 11:
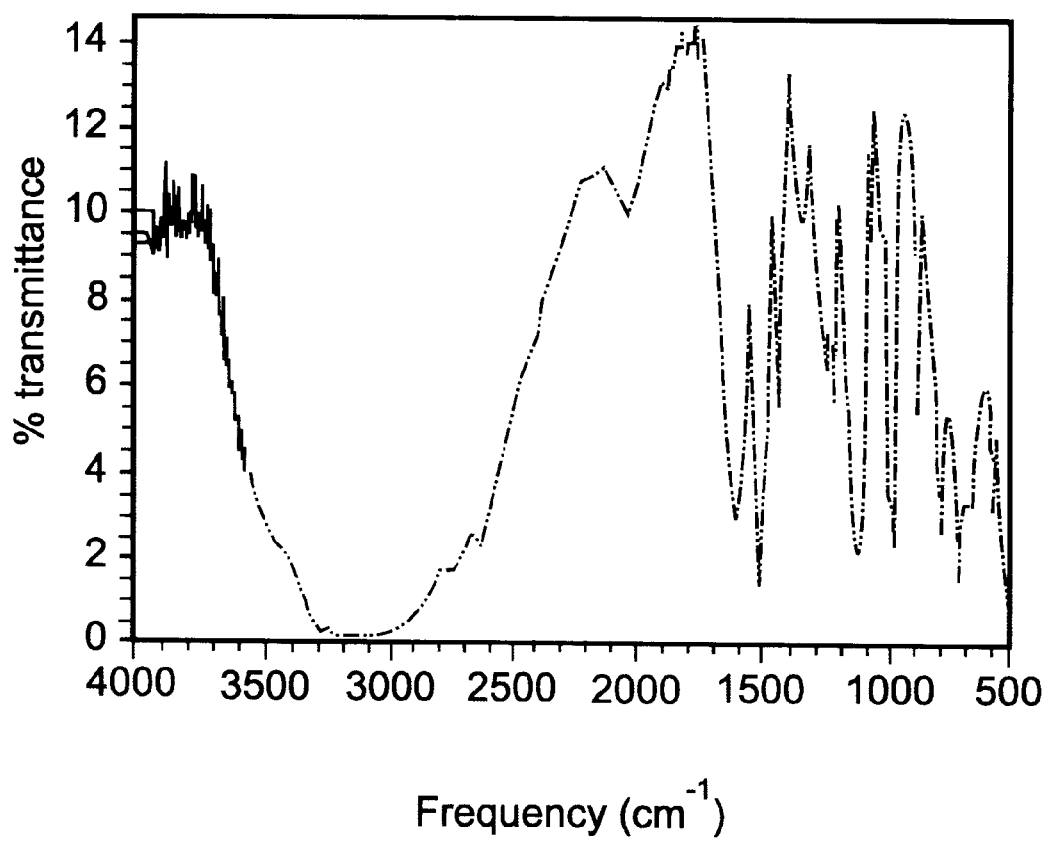
FIG. 11 shows the FT-IR spectrum of the reaction product between an acidic chloroaluminate melt and hydrazine.

Example 3
Reaction of Acidic Molten Salt With Hydrazine
Reaction of Acidic Chloroaluminate Melt With Hydrazine After NH$_3$, the next convenient carbon- and oxygen-free nitrogenous reactant chosen was hydrazine, N$_2$H$_4$. Hydrazine is liquid at room temperature. Reaction of N$_2$H$_4$ with 0.67:0.33 melt, as above, was performed in a similar reactor configuration to Example 1, except that hydrazine was added by a volumetric syringe or cannulus through a rubber septum. Ten mL of N₂H₄ was reacted with 25 mL of 0.67:0.33 melt. As in the case of the melt-NH₃ reaction, reaction of N₂H₄ with melt was highly exothermic. Scaling up the reaction by a factor of 3 produced a dark brown product, whereas performing the reaction on a smaller scale produced a viscous white product. Excess heat generated during the reaction may be a source of differences between these two results. These products did not sublime as did the ammoniate product, making this reaction product suitable for production of precursors for bulk AlN powder preparation. To separate the reaction product from residual melt, crude product was ground, mixed with dry toluene and vacuum filtered under inert atmosphere. This process removes any melt components from the product, since the melt itself is very soluble in toluene (L. V. Interrante et al., *J. Electrochem. Soc.*, 136:472–478 [1989], "Preparation and Properties of Aluminum Nitride Films Using An Organometallic Precursor"). FIG. 11 shows the FT-IR spectra of the reaction product. The broad, unresolved absorption is highly characteristic of polymeric structures.

Example 4

TMPACl:GaCl₃ Molten Salt Phase Diagram

Ambient Temperature Melts Composed of TMPACl and Gallium Chloride

Figure 7:
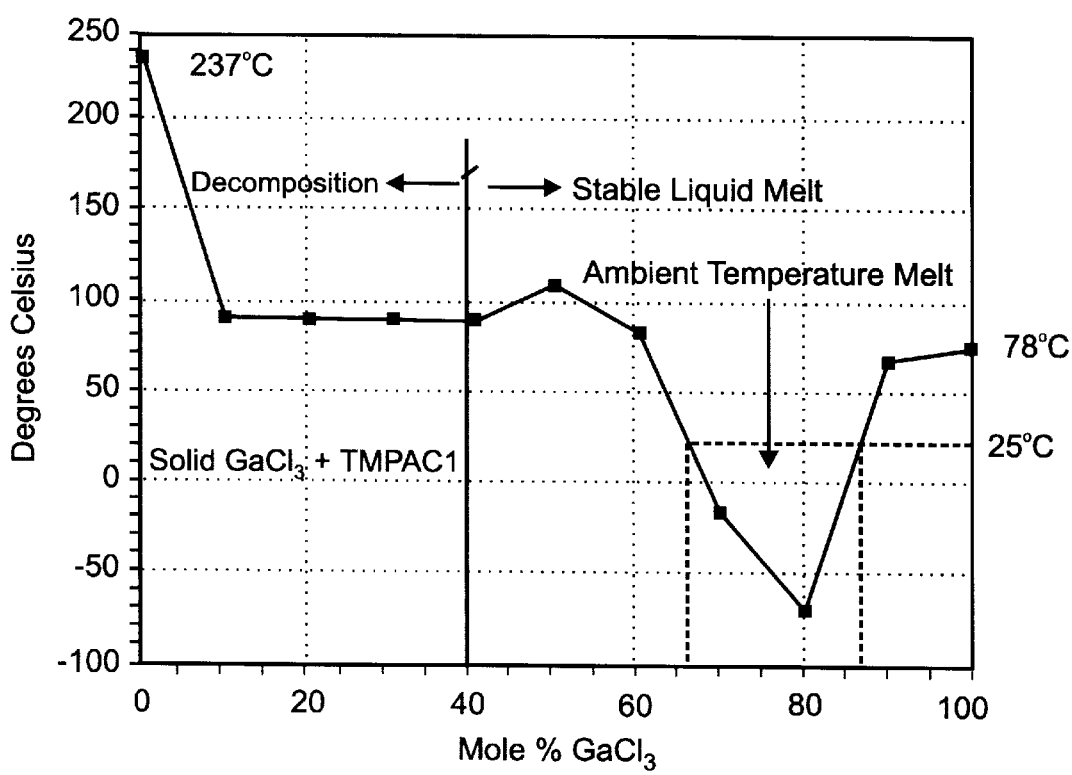
FIG. 7 shows a phase diagram for a $GaCl_3$-TMPACl melt.

Molten salts composed of mixtures of GaCl₃ or InCl₃ with TMPACl represent a convenient means to generate precursors of the corresponding nitrides by a method analogous to that described above for AlN. We examined the phase behavior of these systems. FIG. 7 shows a phase diagram for the GaCl₃-TMPACl melt. The reaction of TMPACl with GaCl₃ was exothermic. The mixture was liquid at ambient or near ambient temperature over a wide range of compositions, approximately 10% to 80% GaCl₃. Basic compositions up to 40 mole % GaCl₃ melted near 100° C. and apparently decomposed over time. Compositions spanning the range 40 to 85% GaCl₃ were stable by visual inspection, forming clear, colorless liquids at the melting point. The ambient temperature liquidus range of this melt was approximately 66–87 mole % GaCl₃. These acidic compositions are useful for preparation of the GaCl₃ analogs of the ammoniates described above. This system also forms room temperature melts of significantly higher acidity than the AlCl₃ system (R. A. Osteryoung in *Molten Salt Chemistry*, supra) or the other GaCl₃ systems. For example, the upper ambient temperature liquidus range of the AlCl₃-TMPACl melt (R. A. Osteryoung, supra) is ca. 67 mole % AlCl₃ while for the GaCl₃-MEIC melt (S. P. Wicelinski et al., *J. Electrochem. Soc.*, 134:262–263 [1987], "Low Temperature Chlorogallate Molten Salt Systems"), the upper limit is ca. 70 mole % GaCl₃. The approximate eutectic composition of FIG. 7 is 80 mole % GaCl₃, significantly more acidic than for other systems.

As shown by the above examples and test results, it is possible with the present invention to create a low-temperature (200° C. or less) molten salt comprising a Group III halide, together with an organic halide, which is capable of reacting with a nitrogen-containing material to form a precursor which can be decomposed by application of heat to form a III-V compound. The specific embodiments described herein are merely exemplary, and changes and modifications in the specifically described embodiments can be carried out by one skilled in the art without departing from the scope of the invention. All such changes and modifications are intended to be included within the scope of the invention as defined in the appended claims.

What is claimed is:

1. A process for preparation of a precursor of a Group III-V compound wherein said precursor comprises M, X and V where M is a Group III metal selected from the group consisting of boron, aluminum, gallium and indium;

X is halide; and

V is a Group V element selected from the group consisting of nitrogen, phosphorous, arsenic, antimony and bismuth;

said process comprising:

(a) preparing an active metal halide ion comprising M by a process comprising forming a mixture of a trihalide of M with an organic halide RX', where R is an asymmetrical organic cation, and X' is a halide which may be the same or different from X, at a molar ratio of MX₃ to RX' such that said mixture forms an acidic salt comprising an active metal halide ion comprising M, X and X' which is molten at about 200° C. or less; and (b) contacting said active halide ion with a V-containing compound whereby said precursor is formed.

2. The process of claim 1 wherein said mixture of step (a) is molten at about 45° C. or less.

3. The process of claim 1 wherein said mixture of step (a) is molten at about ambient temperature or less.

4. The process of claim 1 conducted in the absence of a solvent.

5. The process of claim 1 wherein M is Al.

6. The process of claim 1 wherein M is Ga.

7. The process of claim 1 wherein M is In.

8. The process of claim 1 wherein RX' is selected from the group consisting of:

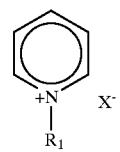

I

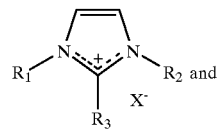

II

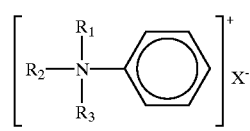

III where R₁, R₂ and R₃ are independently H, alkyl or aryl.

9. The process of claim 1 wherein said organic halide is 1-butylpyridinium chloride (BPC).

10. The process of claim 1 wherein said organic halide is 1-ethyl-3-methylimidazolium chloride (MEIC).

11. The process of claim 1 wherein said organic halide is trimethylphenylammonium chloride (TMPACl).

12. The process of claim 1 wherein said V-containing compound is a nitrogen-containing compound selected from the group consisting of alky-substituted hydrazines, aliphatic and aromatic amines, and azides.

13. The process of claim 1 wherein said V-containing compound does not contain oxygen or carbon.

14. The process of claim 1 wherein said V-containing compound is a nitrogen-containing compound.

15. The process of claim 1 wherein said V-containing compound is ammonia.

16. The process of claim 1 wherein said V-containing compound is hydrazine.

17. A process for forming a Group III-V compound which comprises the steps of:

preparing a precursor of said Group III-V compound according to the process of claim 1, and subjecting said precursor to heat to form said Group III-V compound.

18. The process of claim 17 wherein the Group III metal M of said Group III-V compound is selected from the group consisting of Al, Ga and In.

19. The process of claim 17 wherein X is Cl in said precursor.

20. The process of claim 17 wherein the V-containing compound is a nitrogen-containing compound.

21. The process of claim 17 wherein the Group III-V compound is a metal nitride.

22. A process for preparation of a precursor of a metal nitride which comprises M, nitrogen, and chloride, where M is a metal selected from the group consisting of aluminum, gallium, and indium, comprising:

(a) preparing an active metal chloride ion by a process comprising forming a mixture of a trichloride of said metal with an organic chloride selected from the group consisting of 1-butylpyridinium chloride (BPC), 1-ethyl-3-methylimidazolium chloride (MEIC), and trimethylphenylammonium chloride (TMPACl) at a molar ratio of said metal trichloride to said organic chloride of at least about 3:1 whereby said mixture forms a molten salt comprising an active metal chloride ion at about 200° C. or less; and (b) contacting said active metal chloride ion with ammonia or hydrazine whereby said precursor is formed.

* * * * *